(12) United States Patent
Grimes et al.

(10) Patent No.: US 9,574,864 B2
(45) Date of Patent: Feb. 21, 2017

(54) GAUGE FOR INSTALLATION OF LINERS IN SUBSTRATE SPIN COATING TOOLS

(71) Applicant: INTERNATIONAL BUSINESS MACHINES CORPORATION, Armonk, NY (US)

(72) Inventors: Jeffrey J. Grimes, South Burlington, VT (US); Kevin C. Remillard, Fairfax, VT (US); Matthew F. Stanton, Salt Point, NY (US)

(73) Assignee: International Business Machines Corporation, Armonk, NY (US)

(*) Notice: Subject to any disclaimer, the term of this patent is extended or adjusted under 35 U.S.C. 154(b) by 140 days.

(21) Appl. No.: 14/671,058

(22) Filed: Mar. 27, 2015

(65) Prior Publication Data

US 2016/0282100 A1 Sep. 29, 2016

(51) Int. Cl.

| B05C 11/08 | (2006.01) |
|---|---|
| B05D 3/12 | (2006.01) |
| G01B 5/25 | (2006.01) |
| B05D 1/00 | (2006.01) |
| G01B 5/28 | (2006.01) |
| H01L 21/67 | (2006.01) |
| G03F 7/16 | (2006.01) |

(52) U.S. Cl.
CPC ............... *G01B 5/25* (2013.01); *B05D 1/005* (2013.01); *G01B 5/28* (2013.01); *H01L 21/6715* (2013.01); *B05C 11/08* (2013.01); *G03F 7/162* (2013.01)

(58) Field of Classification Search
CPC .. G01B 5/25; G01B 5/28; B05D 1/005; H01L 21/6715; G03F 7/162
See application file for complete search history.

(56) References Cited

U.S. PATENT DOCUMENTS

| 4,538,357 | A | 9/1985 | Dressel et al. |
|---|---|---|---|
| 5,312,487 | A * | 5/1994 | Akimoto ............. H01L 21/6715 118/302 |
| 5,567,881 | A | 10/1996 | Myers |
| 6,343,503 | B1 | 2/2002 | Goh |
| 8,548,771 | B2 | 10/2013 | Holden et al. |
| 8,727,515 | B2 | 5/2014 | Dowell et al. |
| 2005/0076531 | A1* | 4/2005 | Smith ............... H01L 21/68728 34/313 |

(Continued)

OTHER PUBLICATIONS

Derwent abstract of KR 2004051151, published Jun. 2004.*

*Primary Examiner* — Kirsten Jolley
(74) *Attorney, Agent, or Firm* — Schmeiser, Olsen & Watts; Steven Meyers

(57) ABSTRACT

A gauge and method of use. The gauge includes a body configured to removeably mount to substrate chuck of a spin apply coating tool, the body rotatable about an axis passing through a center of the chuck; an extendable arm having a first end mounted to the body, the extendable arm having a retracted position and a deployed position, a second end of the arm including an upper finger and a lower finger, the upper finger configured to be positioned above a rim of the coat apply bowl and the lower finger positioned below the rim of the coat apply bowl in the deployed position when the coat apply bowl is mounted in the spin apply tool; and wherein the gauge provides an error indication when the gauge is rotated about the axis and the coat apply bowl is not installed in the spin apply coating tool correctly.

20 Claims, 5 Drawing Sheets

(56) References Cited

U.S. PATENT DOCUMENTS

2008/0168673 A1* 7/2008 Herchen ............... G01D 5/342
                                                                     33/550
2015/0343484 A1* 12/2015 Kukas ................... B05C 11/08
                                                                     118/52

* cited by examiner

GAUGE FOR INSTALLATION OF LINERS IN SUBSTRATE SPIN COATING TOOLS

BACKGROUND

The present invention relates to the field of semiconductor fabrication; more specifically, it relates to an apparatus (gauge) for checking for proper installation of liner components in a substrate coating tool and the method of using said apparatus (gauge).

Substrate spin coating tool employ liners to protect the tools from the material being applied. However, if the components of the liner are not installed in the tool correctly or if the components are misaligned to each other a range of coating defects often result. Currently there is no known reliable solution to this problem. Accordingly, there exists a need in the art to mitigate the deficiencies and limitations described hereinabove.

BRIEF SUMMARY

A first aspect of the present invention is a gauge comprising: a body configured to removeably mount to substrate chuck of a spin apply coating tool, the body rotatable about an axis passing through a center of the chuck; an extendable arm having a first end mounted to the body, the extendable arm having a retracted position and a deployed position, a second end of the arm including an upper finger and a lower finger, the upper finger configured to be positioned above a rim of the coat apply bowl and the lower finger positioned below the rim of the coat apply bowl in the deployed position when the coat apply bowl is mounted in the spin apply tool; and wherein the gauge provides an error indication when the gauge is rotated about the axis and the coat apply bowl is not installed in the spin apply coating tool correctly.

A second aspect of the present invention is a method comprising: (a) providing a spin apply coating tool having substrate chuck and a coat apply bowl installed in the spin apply coating tool; (b) providing a gauge comprising: a body configured to removeably mount to the substrate chuck, the body rotatable about an axis passing through a center of the substrate chuck; and an extendable arm having a first end mounted to the body, the extendable arm having a retracted position and a deployed position, a second end of the arm including an upper finger and a lower finger, the upper finger configured to be positioned above a rim of the coat apply bowl and the lower finger positioned below the rim of the coat apply bowl in the deployed position when the coat apply bowl is mounted in the spin apply tool; (c) placing the gauge on the substrate chuck and moving the arm to the deployed position and rotating the gauge at least 360° about the axis; and (d) if the gauge provides an error indication, moving arm to the retracted position, removing the gauge from the substrate and repositioning or replacing the coat apply bowl and repeating steps (c) and (d); and if the gauge does not provides an error indication, moving the arm to the retracted position, removing the gauge from the substrate, and releasing the spin apply coating tool for production.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

The present invention is a gauge that is placed on the substrate chuck of a spin coating tool after the liner components are installed on the spin coating tool. The upper most component (coat apply bowl) has the shape of a circular inverted bowl with a circular opening centered in the bottom of the bowl. An arm mounted on the gauge is swung out so two fingers spaced apart on the end of the arm are positioned with one finger above and one finger below the rim of the opening and the gauge rotated by hand. The distance between the fingers ensures the height of the rim above the top surface of the substrate chuck is within tolerance. If the liner components are installed correctly the fingers will not make contact with the coat apply bowl and rotate easily. If the fingers on the arm touch the coat apply bowl at any point in the rotation the gauge (the coat apply bowl is not installed correctly) will provide an error indication (e.g., scraping noise, resistance to rotation, movement of the coat apply bowl or check gauge).

Figure 1:
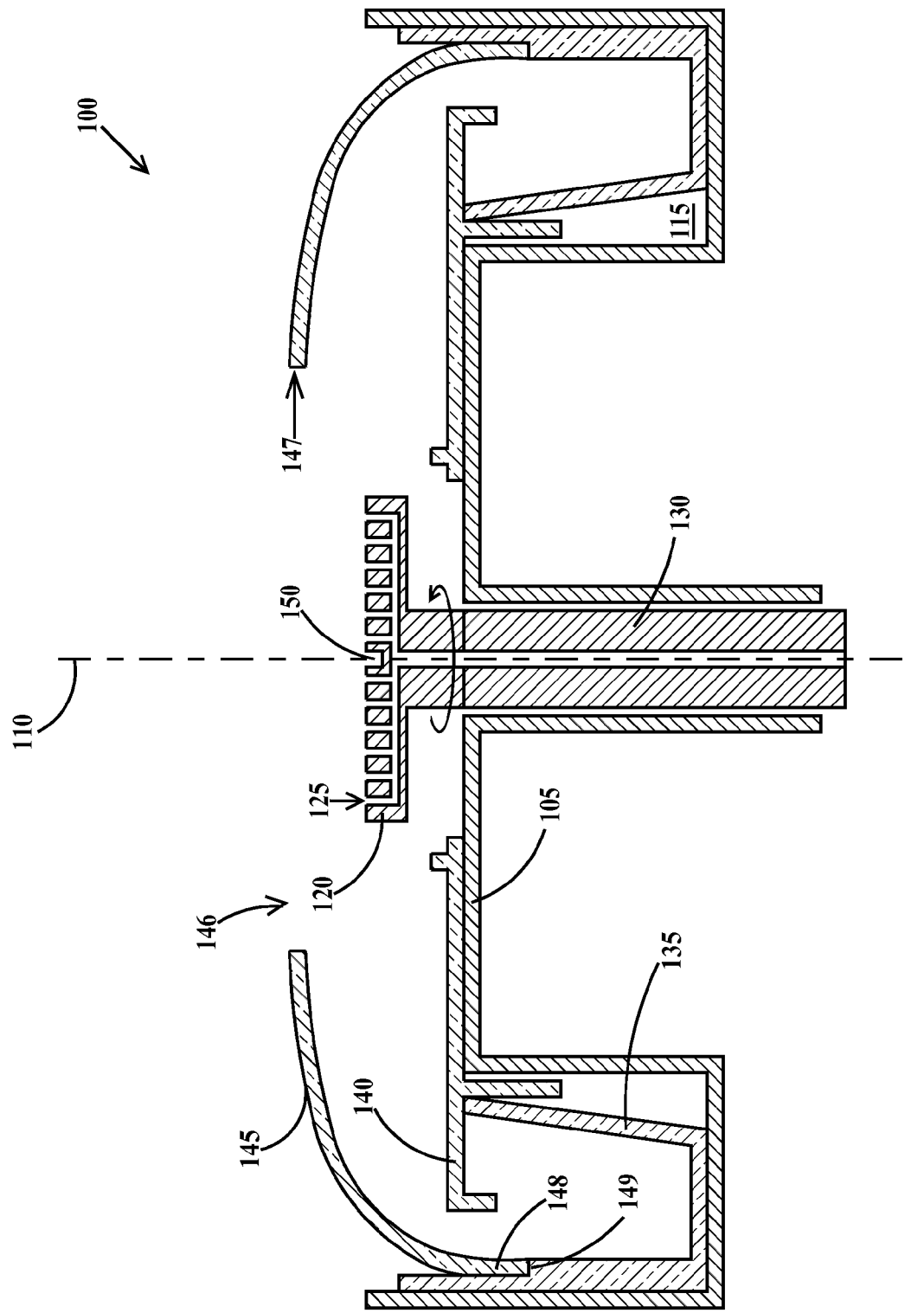
FIG. 1 is a cross-section view through the apply region of a substrate coating tool with liner components installed.

FIG. 1 is a cross-section view through the apply region of a substrate coating tool with liner components installed. In FIG. 1, a spin apply coating tool 100 includes a circular body 105 centered on a vertical axis 110 and having a circular basin 115 along the perimeter of the body. A circular substrate chuck 120 centered on vertical axis 110, and having vacuum ports 125 is removeably attached to a shaft 130 that is rotatable about axis 110. Installed in basin 115 is a circular coat apply liner 135 centered on vertical axis 110. Installed on body 105 is a circular coat apply shield 140 centered on vertical axis 110 and which extends over coat apply liner 135 in basin 115. Installed on coat apply liner 135 is a circular coat apply bowl 145 centered on vertical axis 110 and having a circular opening 146 also centered on vertical axis 110. The shape of coat apply bowl 145 is an inverted bowl having circular opening 146 in its bottom. Edges of opening 146 define a rim 147. The outer edges 148 of coat apply bowl 145 are fitted into notches 149 in the outer wall of coat apply liner 135. Coat apply liner 135, coat apply shield 140 and coat apply bowl 145 comprise a liner assembly. Chuck 120 includes a locating hole 150 (that also serves as a vacuum port) centered on axis 110.

The liner assembly is installed by installing coat apply liner 135 in basin 115, next installing coat apply shield 140, and next installing coat apply bowl 145 in coat apply liner 135. In one example, coat apply liner 135, coat apply shield 140 and coat apply bowl 145 are comprised of plastic or polymeric material examples of which include but are not limited to polyethylene and polypropylene. In one example, coat apply liner 135, coat apply shield 140 and coat apply bowl 145 are designed to be disposable. Because of the manufacturing process for coat apply liner 135, coat apply shield 140 and coat apply bowl 145 they are subject to warpage. The gauge of the embodiments of the present invention will detect out of specification warpage as well as improper installation of coat apply liner 135, coat apply shield 140 and coat apply bowl 145 in tool 100 as well miss-fitting of coat apply liner 135, coat apply shield 140 and coat apply bowl 145 to one another.

Figure 2:
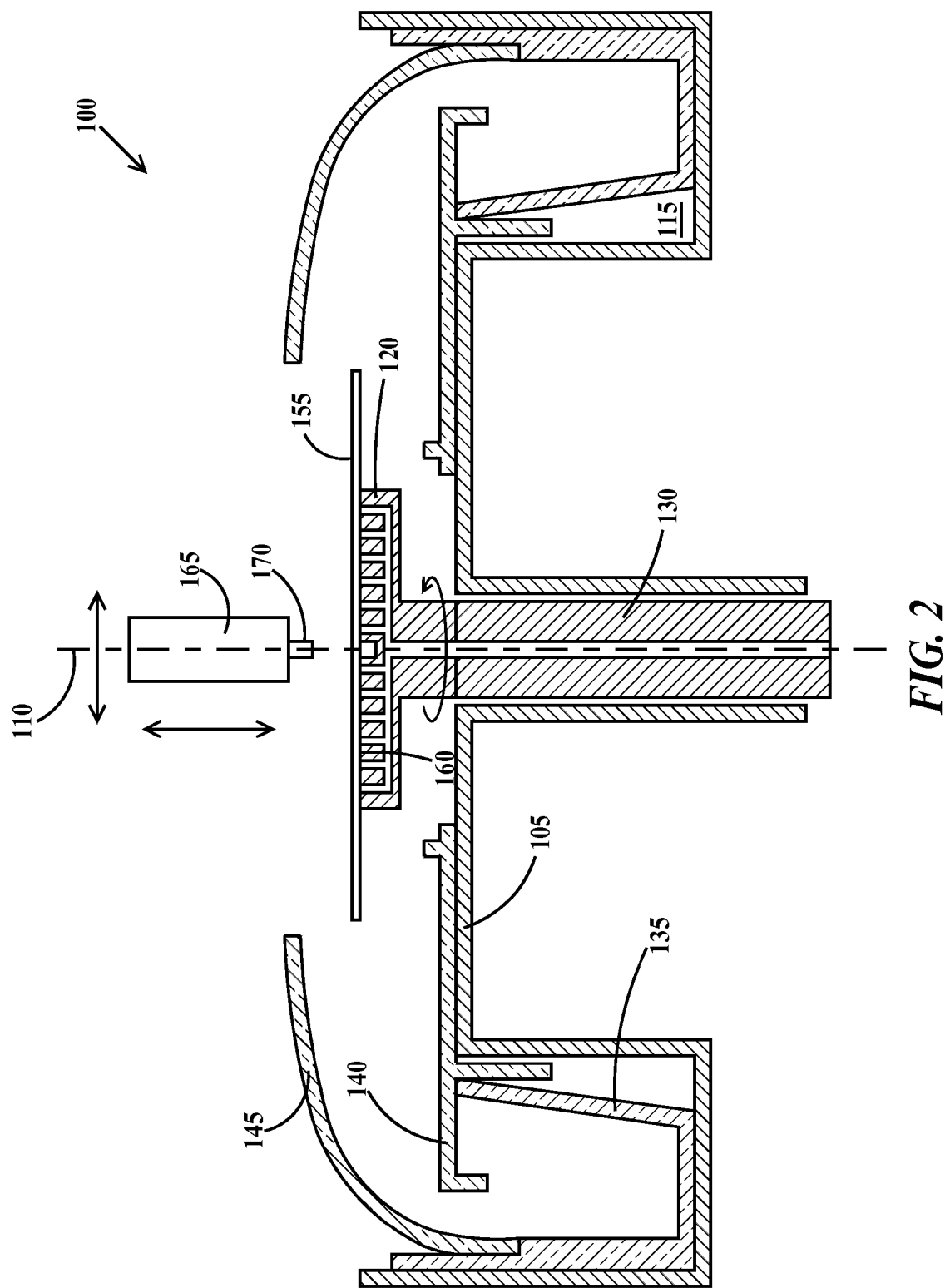
FIG. 2 is a cross-section view through the apply region of the substrate coating tool with liner components installed and a substrate on the substrate chuck.

FIG. 2 is a cross-section view through the apply region of the substrate coating tool with liner components installed and a substrate on the substrate chuck. In FIG. 2 a substrate 155 is illustrated on a top surface 160 of substrate chuck 120. A dispense head 165 having a nozzle 170 is illustrated over substrate 155. Dispense head is mounted to an arm (not shown) so the dispense head can be moved up and down and be retracted from over substrate 155 to a docking area (not shown). In one example, tool 100 dispenses photoresist and substrate 155 is a circular semiconductor wafer. Other examples of substrates include, but are not limited to glass, ceramic, plastic and metal. Other examples of fluids that may be dispensed include, but are not limited to polyimides, poly silsesquioxane polymers, organic solvents, adhesion agents, and antireflective fluids.

Figure 3:
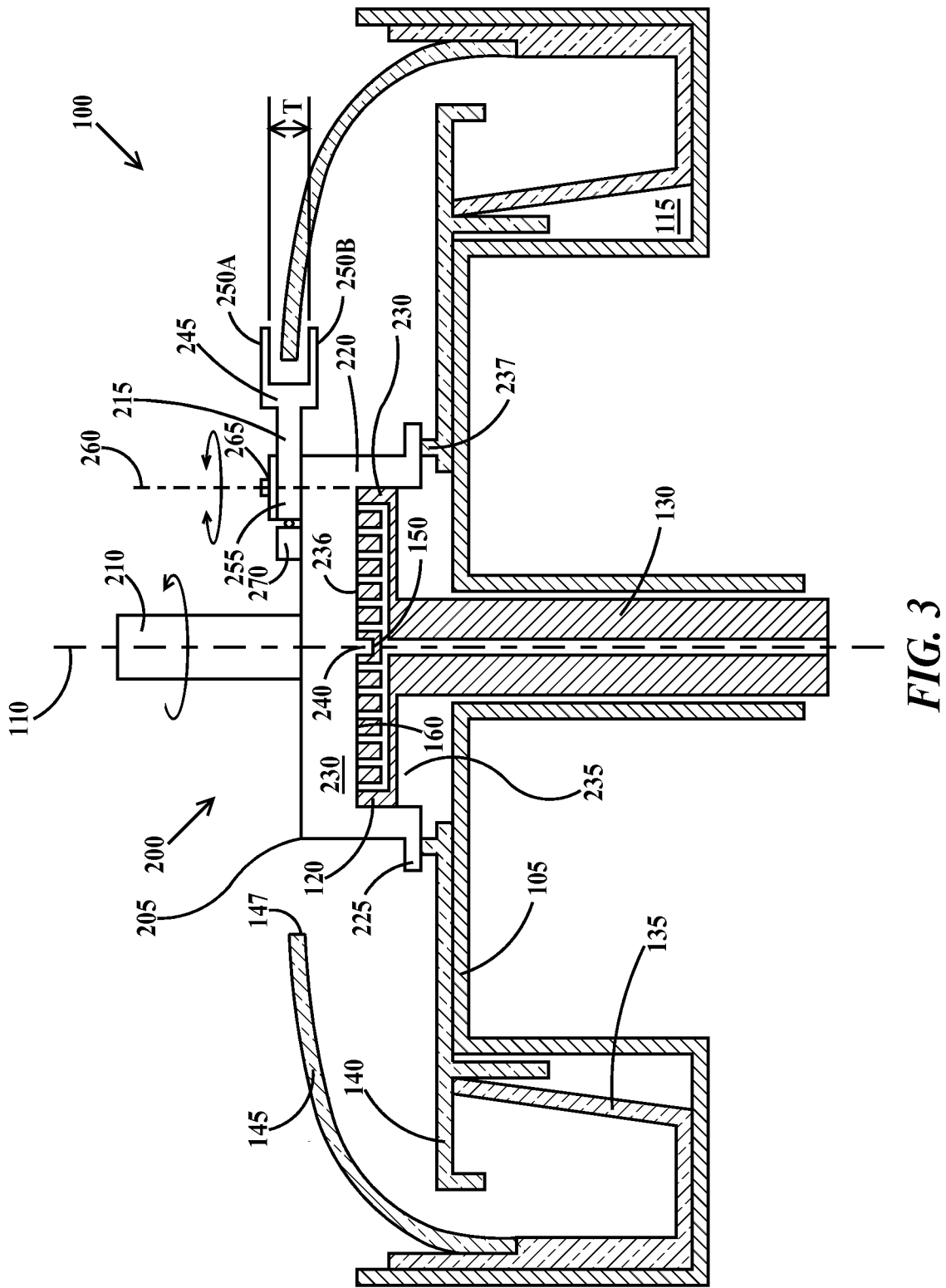
FIG. 3 is a cross-section view through the apply region of the substrate coating tool with liner components installed and a gauge installed according to an embodiment of the present invention.

FIG. 3 is a cross-section view through the apply region of the substrate coating tool with liner components installed and a gauge installed according to an embodiment of the present invention. In FIG. 3 a gauge 200 has been installed and arm 215 deployed on tool 100. Gauge 200 includes a circular body 205, a handle 210 fixed to body 205, and a movable swing arm 215. Circular body 205 includes a sidewall 220 between a perimeter bottom lip 225 and a top 230. Body 205 includes a circular cavity 235 configured to mate with chuck 120. In one example, body 205, sidewall 220, lip 225 and top 230 are integrally formed. When placed on chuck 120 the underside 236 of top 230 contacts top surface 160 of chuck 120 and lip 225 sits just above but does not contact a raised ring 237 of coat apply shield 140. A pin 240 projecting from top 230 mates to hole 150 in chuck 120. In one example, gauge 200 is fabricated from acetal homopolymer (e.g., Delrin™ of Dupont) nylon or glass filled nylon.

Arm 215 has a first end 245 having an upper finger 250A and a lower finger 250B and a second opposite end 255 rotatable on an axis 260 and attached to top 230 by retaining screw 265. A detent mechanism 270 holds arm 215 in its deployed position (as illustrated), but allows retraction of the arm so gauge 200 may be removed without moving or otherwise disturbing coat apply bowl 145. Axis 260 is parallel to axis 110 and handle 210 and body 205 are rotatable about axis 110. The reference plane for gauge 200 is the top surface 160 of chuck 120. Lip 225 acts as a gauge between coat apply shield 140 and the reference plane. Arm 215 acts as a gauge between coat apply bowl 145 and the reference plane. Together lip 225 and arm 215 act as a gauge for coat apply liner 135. The distance T between the inside surfaces of fingers 250A and 250B is the tolerance around the height of rim 147 of coat apply bowl 145 above the reference plane.

Figure 4:
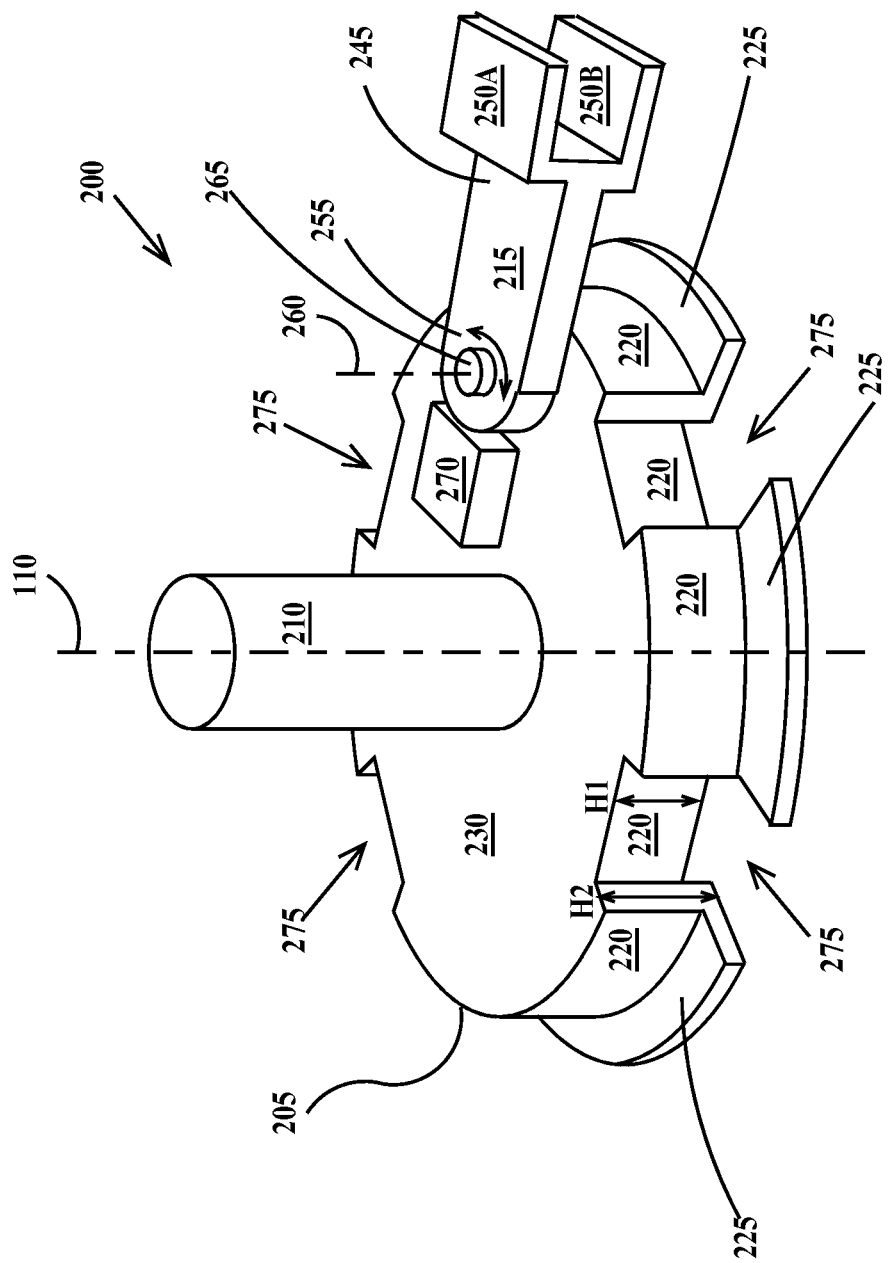
FIG. 4 is an isometric view of a gauge according to an embodiment of the present invention.

FIG. 4 is an isometric view of a gauge according to an embodiment of the present invention. In FIG. 4, optional view ports 275 have been cut into lip 225 and sidewall 220. The view ports have been cut such that the height H1 of sidewall 220 inside view ports 275 is less than the height H2 of sidewall 220 on either side of view ports 275. This allows a view under the body 205 so as to view the chuck 120 (see FIG. 1) and determine if gauge 200 is properly seated on the chuck as well as properly seated on coat apply shield 140. FIG. 4 also illustrates that arm 215 is mounted to top surface 230 of body 205. Alternatively arm 215 may be rotateably mounted to handle 210. Also detent mechanism 270 is mounted to top surface 230 between retaining screw 255 and handle 210. While four evenly spaced view ports 275 are illustrated, there may be a few as one notch or more than four notches. Further the view ports 275 do not need to be evenly spaced and may be of the same size or different sizes.

Figure 5:
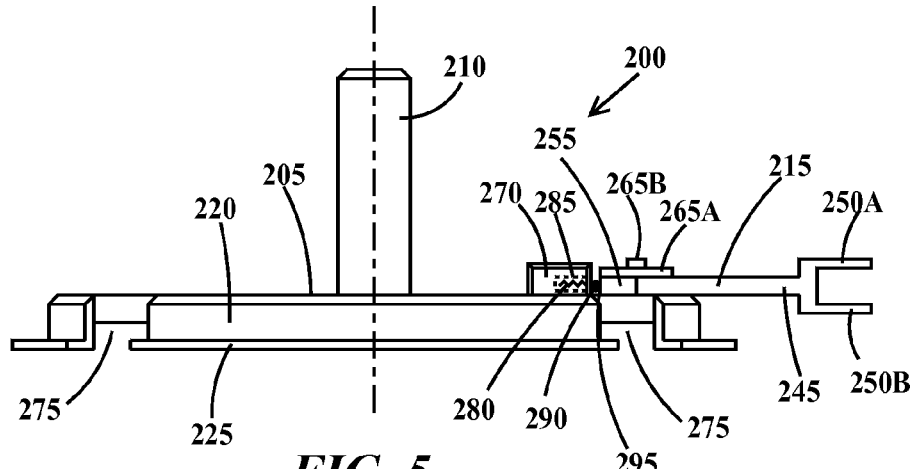
FIG. 5 is side view of the gauge according to an embodiment of the present invention and FIG. 5A is a detail view of a portion of FIG. 5.
Figure 5A:
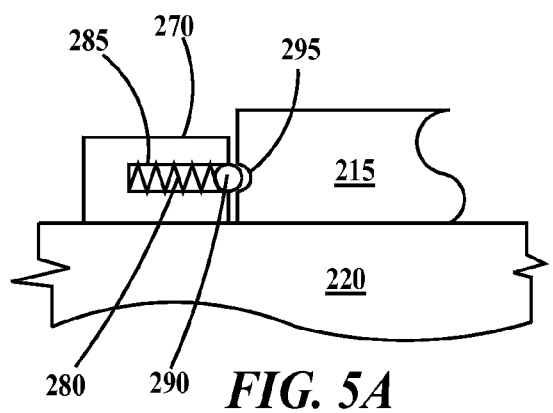

FIG. 5 is side view of the gauge according to an embodiment of the present invention and FIG. 5A is a detail view of a portion of FIG. 5. FIGS. 5 and 5A illustrate additional details of detent mechanism 270 and FIG. 5 further illustrates the height difference of sidewall 220 in view ports 275 and on either side of the notches, clearly illustrating the ability to view under gauge 210 when placed on chuck 120 (see FIG. 3). Detent mechanism 270 includes a spring 280 in a bore 285 and a ball 290 which engages a detent 295 in arm 215.

Figure 6:
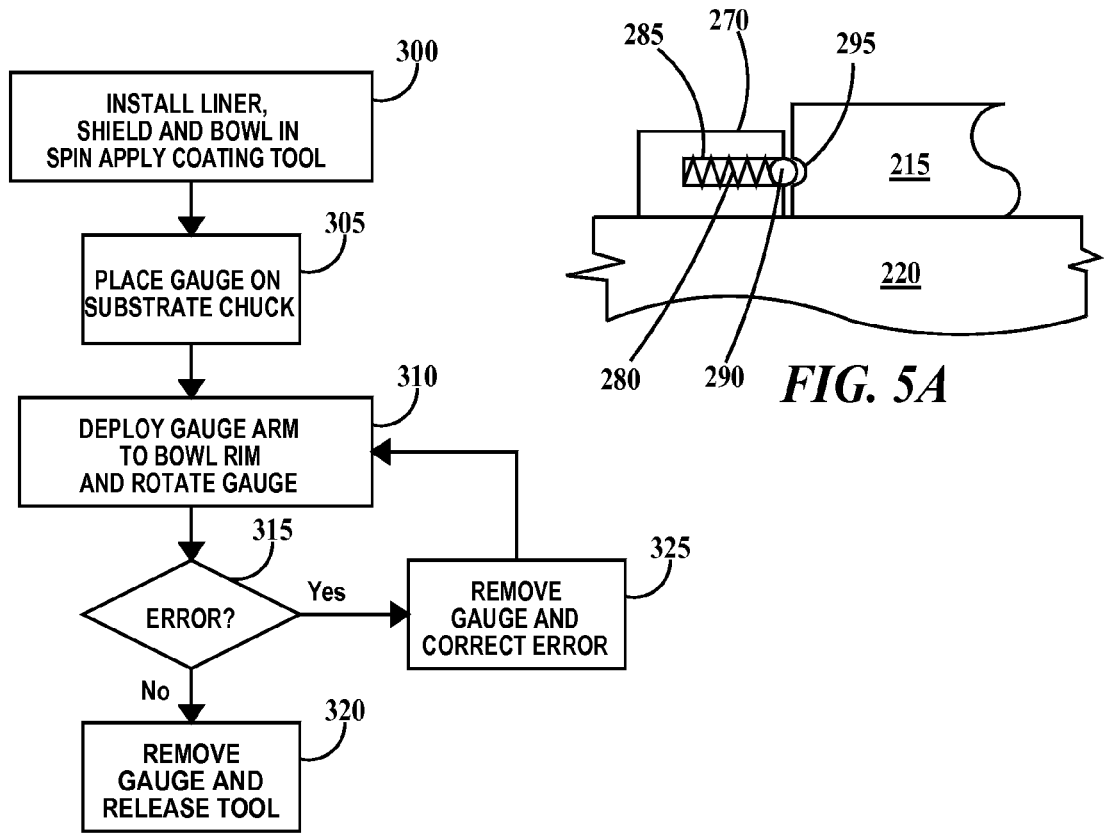
FIG. 6 is a flowchart describing use of the gauge according to an embodiment of the present invention.

FIG. 6 is a flowchart describing use of the gauge according to an embodiment of the present invention. In step 300, the coat apply liner 135, coat apply shield 140 and coat apply bowl 145 are installed in spin apply coating tool (see FIG. 1). In step 305, gauge 200 is placed on substrate chuck 120 (see FIG. 3). In step 310, arm 215 is rotated to deploy fingers 250A and 250B respectively above and below rim 147 of coat apply bowl 145 and gauge 200 rotated at least 360° about axis 110 (see FIG. 3) or until there is an error indication (e.g., visual, audio, or tactual). If, in step 315 there is no error indication, then in step 320, arm 215 is rotated to a home position so no portion of arm 215 in under coat apply bowl 145 and gauge 200 (see FIG. 3) removed and the tool is released for production. If in step 315, there is an error indication, the method proceeds to step 325. In step 325, arm 215 is rotated to a home position so no portion of arm 215 in under coat apply bowl 145 and gauge 200 (see FIG. 3) removed. Next, the liner assembly (coat apply liner, coat apply shield and coat apply bowl) is examined for incorrect assembly, incorrect placement, and incorrect alignment and for warped parts and the cause of the error indication corrected. The method then proceeds to step 310.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A gauge comprising:
  a body configured to removeably mount to substrate chuck of a spin apply coating tool, said body rotatable about an axis passing through a center of said chuck;
  an extendable arm having a first end mounted to said body, said extendable arm having a retracted position and a deployed position, a second end of said arm including an upper finger and a lower finger, said upper finger configured to be positioned above a rim of a coat apply bowl and said lower finger positioned below said rim of said coat apply bowl in said deployed position when said coat apply bowl is mounted in said spin apply tool; and wherein said gauge provides an error indication when said gauge is rotated about said axis and said coat apply bowl is not installed in said spin apply coating tool correctly.

2. The gauge of claim 1, wherein said gauge provides said error indication when said gauge is rotated about said axis and either said upper finger or lower finger touch said rim of said coat apply bowl at any point during said rotation.

3. The gauge of claim 1, wherein said gauge does not provide said error indication when said gauge is rotated about said axis and neither said upper finger nor lower finger touch said rim of said coat apply bowl at any point during said rotation.

4. The gauge of claim 1, wherein said error indication is visual, audio, or tactual.

5. The gauge of claim 1, wherein said error indication is a scraping noise, resistance to rotation or movement of the coat apply bowl.

6. The gauge of claim 1, further including a handle attached to a top surface of said body, said handle adapted to allow said body to be turned 360° about said axis.

7. The gauge of claim 1, further including one or more view ports in a sidewall of said body to provide visual inspection of a position of a coat apply shield installed on said spin apply coating tool under said coat apply bowl.

8. The gauge of claim 1, wherein a top surface of said substrate chuck defines a reference plane and a distance between said upper finger and said lower finger defines a tolerance around the height of said rim of said coat apply bowl above said reference plane.

9. The gauge of claim 1, wherein said body has the form of a cylinder having a closed top and open bottom and said substrate chuck is circular.

10. The gauge of claim 9, further including a pin extending from a bottom surface of said closed top toward said open bottom, said pin configured to rotateably engage a hole in a top surface of said substrate chuck.

11. A method comprising:
(a) providing a spin apply coating tool having substrate chuck and a coat apply bowl installed in said spin apply coating tool;
(b) providing a gauge comprising:
a body configured to removeably mount to said substrate chuck, said body rotatable about an axis passing through a center of said substrate chuck; and
an extendable arm having a first end mounted to said body, said extendable arm having a retracted position and a deployed position, a second end of said arm including an upper finger and a lower finger, said upper finger configured to be positioned above a rim of said coat apply bowl and said lower finger positioned below said rim of said coat apply bowl in said deployed position when said coat apply bowl is mounted in said spin apply tool;
(c) placing said gauge on said substrate chuck and moving said arm to said deployed position and rotating said gauge at least 360° about said axis; and
(d) if said gauge provides an error indication, moving arm to said retracted position, removing said gauge from said substrate and repositioning or replacing said coat apply bowl and repeating steps (c) and (d); and if said gauge does not provides an error indication, moving said arm to said retracted position, removing said gauge from said substrate, and releasing said spin apply coating tool for production.

12. The method of claim 11, said gauge providing said error indication when said gauge is rotated about said axis and either said upper finger or lower finger touch said rim of said coat apply bowl at any point during said rotation.

13. The method of claim 11, said gauge not providing said error indication when said gauge is rotated about said axis and neither said upper finger nor lower finger touch said rim of said coat apply bowl at any point during said rotation.

14. The method of claim 11, wherein said error indication is visual, audio, or tactual.

15. The method of claim 11, wherein said error indication is a scraping noise, resistance to rotation or movement of the coat apply bowl.

16. The method of claim 11, said gauge further including a handle attached to a top surface of said body, said handle adapted to allow said body to be turned 360° about said axis.

17. The method of claim 11, said gauge further including one or more view ports in a sidewall of said body to provide visual inspection of a position of a coat apply shield installed on said spin apply coating tool under said coat apply bowl and said method step (d) further including visually inspecting a position of said coat apply shield and if said coat apply shield is not correctly positioned, removing said gauge from said substrate, removing said coat apply bowl, repositioning said coat apply shield, replacing said coat apply bowl and repeating steps (c) and (d); and if said coat apply shield is correctly positioned and there is no error indication moving said arm to said retracted position, removing said gauge from said substrate, and releasing said tool for production.

18. The method of claim 11, wherein a top surface of said substrate chuck defines a reference plane and a distance between said upper finger and said lower finger defines a tolerance around the height of said rim of said coat apply bowl above said reference plane.

19. The method of claim 11, wherein said body has the form of a cylinder having a closed top and open bottom and said substrate chuck is circular.

20. The method of claim 19, said gauge further including a pin extending from a bottom surface of said closed top toward said open bottom, said pin configured to rotateably engage a hole in a top surface of said substrate chuck.

* * * * *